US011233167B2

(12) United States Patent
Schueppen

(10) Patent No.: US 11,233,167 B2
(45) Date of Patent: Jan. 25, 2022

(54) OPTOELECTRONIC SEMICONDUCTOR COMPONENT

(71) Applicant: AE 111 Autarke Energie GmbH, Liebenfels (AT)

(72) Inventor: Andreas Paul Schueppen, Graz (AT)

(73) Assignee: AE 111 AUTARKE ENERGIE GMBH, Liebenfels (AT)

( * ) Notice: Subject to any disclaimer, the term of this patent is extended or adjusted under 35 U.S.C. 154(b) by 0 days.

(21) Appl. No.: 16/632,951

(22) PCT Filed: Jun. 7, 2018

(86) PCT No.: PCT/EP2018/065055
§ 371 (c)(1),
(2) Date: Jan. 22, 2020

(87) PCT Pub. No.: WO2019/029861
PCT Pub. Date: Feb. 14, 2019

(65) Prior Publication Data
US 2020/0152816 A1   May 14, 2020

(30) Foreign Application Priority Data
Aug. 9, 2017  (EP) .................................... 17185538

(51) Int. Cl.
*H01L 31/0745* (2012.01)
*H01L 31/0725* (2012.01)
(Continued)

(52) U.S. Cl.
CPC .. *H01L 31/0745* (2013.01); *H01L 31/035254* (2013.01); *H01L 31/0725* (2013.01);
(Continued)

(58) Field of Classification Search
CPC ............ H01L 31/0745; H01L 31/0725; H01L 31/0747; H01L 31/076; H01L 31/03687;
(Continued)

(56) References Cited

U.S. PATENT DOCUMENTS 5,403,404 A * 4/1995 Arya ................. H01L 31/03765
136/249
6,166,319 A   12/2000 Matsuyama
(Continued)

FOREIGN PATENT DOCUMENTS

DE   102005047221 A1   4/2007
DE   102006024850 A1   11/2007
(Continued)

OTHER PUBLICATIONS

Hauser et al., Performance Limitations of Silicon Solar Cells, Apr. 1977, IEEE Transactions on Electron Devices, vol. Ed-24, No. 4, 305-321. (Year: 1977).*

*Primary Examiner* — Andrew J Golden
(74) *Attorney, Agent, or Firm* — Slater Matsil, LLP

(57) ABSTRACT

An optoelectronic semiconductor component is disclosed. In an embodiment an optoelectronic semiconductor component includes a front side, a first diode and a second diode arranged downstream of one another in a direction away from the front side and electrically connected in series such that the first diode is located closer to the front side than the second diode and an electrical tunnel contact between the first and the second diodes, wherein the second diode comprises a diode layer of $Si_nGe_{1-n}$, where $0 \le n \le 1$, wherein the first diode comprises a first partial layer of SiGeC, a second partial layer of SiGe and a third partial layer of SiGeC, and wherein the partial layers follow one another directly in the direction away from the front side according to their numbering such that the first and third partial layers
(Continued)

are of $(Si_yGe_{1-y})_{1-x}C_x$, whereas $0.05 \leq x \leq 0.5$ or $0.25 \leq x \leq 0.75$, and whereas $0 \leq y \leq 1$, and the second partial layer is of $Si_zGe1-z$, whereas $0 \leq z \leq 1$.

13 Claims, 2 Drawing Sheets

(51) Int. Cl.
  *H01L 31/0352* (2006.01)
  *H01L 31/028* (2006.01)
  *H01L 31/0368* (2006.01)
  *H01L 31/0376* (2006.01)

(52) U.S. Cl.
  CPC ...... *H01L 31/028* (2013.01); *H01L 31/03682* (2013.01); *H01L 31/03765* (2013.01)

(58) Field of Classification Search
  CPC .............. H01L 31/03685; H01L 31/028; H01L 31/0288; H01L 31/035254; H01L 31/03762; H01L 31/03765; H01L 31/03767; H01L 31/035218; H01L 31/03682

USPC .................................................. 136/243–265
See application file for complete search history.

(56) References Cited

U.S. PATENT DOCUMENTS

| | | | |
|---|---|---|---|
| 2010/0300505 A1* | 12/2010 | Chen | H01L 31/035218 136/244 |
| 2013/0025658 A1* | 1/2013 | Bedell | H01L 31/0725 136/255 |
| 2014/0048122 A1 | 2/2014 | Fogel et al. | |
| 2014/0077210 A1* | 3/2014 | Hekmatshoartabari | H01L 31/03762 257/53 |
| 2014/0209156 A1 | 7/2014 | Schueppen | |
| 2016/0260860 A1 | 9/2016 | Meusel et al. | |

FOREIGN PATENT DOCUMENTS

| | | |
|---|---|---|
| EP | 0895291 A2 | 2/1999 |
| WO | 2016012274 A1 | 1/2016 |

* cited by examiner

OPTOELECTRONIC SEMICONDUCTOR COMPONENT

This patent application is a national phase filing under section 371 of PCT/EP2018/065055, filed Jun. 7, 2018, which claims the priority of European patent application 17185538.0, filed Aug. 9, 2017, each of which is incorporated herein by reference in its entirety.

TECHNICAL FIELD

An optoelectronic semiconductor component is provided.

US Patent Application No. 2014/0048122 A1 relates to a tandem solar cell in which an upper diode is based on silicon and comprises a SiC layer. A lower diode comprises a germanium layer as a base for nanowires.

SUMMARY

Embodiments provide an optoelectronic semiconductor component which has a high degree of power efficiency and energy efficiency with regard to the conversion of light power and light energy into electrical power or energy. The optoelectronic semiconductor component is in particular a solar cell having an open terminal voltage $V_{oc}$ of more than 1 V.

According to at least one embodiment, the optoelectronic semiconductor component has a front side. It is possible for radiation such as solar radiation to enter the semiconductor component through the front side. The front side may be a radiation inlet side. A light inlet layer, especially an anti-reflection layer, can be located on the radiation inlet side.

According to at least one embodiment, the semiconductor component comprises a first diode and a second diode, which are connected in series. The diodes may also be referred to as top and bottom diodes. The first and the second diodes are arranged downstream of each other in the direction away from the front side. The first diode is located closer to the front side than the second diode. In plan view, the front side, the first diode and/or the second diode can be arranged congruently.

According to at least one embodiment, the semiconductor component has an electrical semiconductor tunnel contact. The tunnel contact is located between the first and the second diode. The two diodes are electrically connected in series by means of the tunnel contact.

In one embodiment, the optoelectronic semiconductor component, which is preferably a silicon-based tandem solar cell, has a front side and a first diode and a second diode. The first diode is located closer to the front side than the second diode and the diodes follow one another in the direction away from the front side. An electrical tunnel contact is located between the first and the second diode. The semiconductor component is based on silicon. The first diode comprises at least one partial layer of SiGeC. The second diode is a Si diode comprising a diode layer made of $Si_nGe_{1-n}$, where $0 \leq n \leq 1$.

According to at least one embodiment, the first diode and the second diode and the tunnel contact are monolithically produced on top of each other. This means that these components are preferably integrated in a common semiconductor body without connection means and/or in a monolithic manner.

The tunnel contact can be constructed as described in document DE 10 2005 047 221 B4, see in particular paragraph 9, or as described in the document S. M. Sze, Physics of Semiconductor Devices, New York, Wiley, 1981, pages 516ff. The tunnel contact is primarily referred to as band-to-band tunneling, also referred to as intergap tunneling.

According to at least one embodiment, the semiconductor device is based on silicon. That is, the substance of the semiconductor device is Si. Likewise, the essential electrical functions of the semiconductor component go back to Si. This does not preclude one or more dopants from being present, or that the Si is partially replaced by other materials, particularly by Group IV materials such as carbon and/or germanium. This means that the semiconductor component is, in particular, a silicon-based solar cell.

According to at least one embodiment, the first diode or upper diode comprises a plurality of partial layers. At least one of the partial layers, the plurality of the partial layers or all of the partial layers of the first diode are made of $(Si, Ge)_{1-x}C_x$. In this case, preferably $0.05 \leq x \leq 0.6$ or $0.05 \leq x \leq 0.5$ applies, with any dopants possibly present being neglected. Si and Ge may be present in any mixture ratios, including the case that only Si or only Ge is present. In addition, various phases can be mixed, for example SiC and GeC. In this way, the expression $(Si, Ge)_{1-x}C_x$ can refer to an average composition over the relevant layer.

According to at least one embodiment, the second or lower diode comprises a diode layer, in particular as part of a pn junction, wherein a layer of $Si_nGe_{1-n}$ can be incorporated in the space charge zone of this pn junction, wherein this layer is preferably the diode layer. $0 \leq n \leq 1$ or $0 \leq n \leq 1$ or $0 < n \leq 1$ applies, in particular $0 \leq n \leq 0.95$, preferably $0 \leq n \leq 0.8$, such that the Ge fraction is at least 20%. The layer can be a pure Ge layer. Again, any dopants possibly present are neglected.

Thus, a silicon-based optoelectronic semiconductor component is provided comprising two series-connected diodes which are connected by a tunnel contact. The upper or first diode comprises at least one layer consisting of SiC (silicon carbide) or GeC (germanium carbide) or $(Si, Ge)_{1-x}C_x$ whereas $0.25 \leq x \leq 0.75$, and at the same time the lower or second diode contains a layer consisting of Ge (germanium) or SiGe (silicon germanium).

According to at least one embodiment, the optoelectronic semiconductor component, which is preferably a solar cell, has a front side and a first diode and a second diode. The first diode is located closer to the front side than the second diode and the diodes follow one another in the direction away from the front side. An electrical tunnel contact is located between the first diode and the second diode. The semiconductor component is based on silicon. The first diode comprises at least one partial layer of $(Si, Ge)_{1-x}C_x$. The second diode comprises at least one diode layer made of $Si_nGe_{1-n}$. In this case, preferably $0.05 \leq x \leq 0.5$ and $0 \leq n \leq 1$ or $0 \leq n < 1$ applies.

In other words, the semiconductor component can be a silicon-based tandem solar cell, the two diodes of which are characterized in that the first diode, in particular in the form of the partial layer, contains an ultraviolet absorber and the second diode, in particular in the form of the diode layer, contains an infrared absorber. As a result, the spectrum which can be used by the semiconductor component is expanded from approximately 300 nm to 1500 nm. The partial layer of the first diode is preferably a silicon carbide layer and/or a germanium carbide layer and the diode layer of the second diode is preferably a Si diode and can be supplemented by a germanium layer or a silicon germanium layer.

The solar cells with the currently highest known efficiencies are merely laboratory patterns and are usually based on III-V semiconductor materials. Their efficiency is up to 45% in laboratory samples. Commercial solar cells, on the other hand, have peak efficiencies in the range of up to 25%, depending on the material system used and depending on the layering. Commercial solar cells in production based on crystalline silicon currently normally have an efficiency in the range of 17% to 23%.

The semiconductor component described here is provided with a tandem solar cell based on silicon. Hitherto, silicon-based solar cells have hardly been resorted to the tandem concept, since no materials with different band gaps are available in the silicon material system to such an extent that they are not cost-efficient to produce and/or have only inadequate long-term stability, such as, for example, perovskites. On the other hand, the semiconductor device described here can be constructed with tested techniques and materials with known properties.

In this case, the upper cell, that is, the first diode, preferably serves essentially for generating charge carriers from blue light and from ultraviolet radiation and the lower cell, that is, the second diode, in particular only for generating charge carriers from light at wavelengths above approximately 500 nm into the infrared spectral range. In operation, a current is thus generated which runs through the two cells connected in series and which can be above 7 A for a standard Mo cell. By means of the series connection of the cells, that is, the two diodes, the open terminal voltages of the two cells add up to approximately 1V to 1.2 V, so that an efficiency of more than 30% can be achieved. This means that a power of 7 W or more can be realized for a standard solar cell with dimensions of 156 mm×156 mm. Today, the best silicon cells at a typical size of 156 mm×156 mm have approximately a maximum of 5 W.

For this purpose, at least one partial layer of the first diode consists of a material with a high band spacing, preferably of silicon carbide and/or germanium carbide, or of amorphous silicon or amorphous germanium. The band spacing of this material is in particular between 2.4 eV and 3.2 eV, in order to convert, in particular, short-wave photons in the wavelength range from 300 nm to 500 nm into electrical current. The first diode can be improved by the space charge zone comprising a quantum structure of SiGeC/SiGe/SiGeC. Such a structure, also referred to as a double tunneling structure, allows for increased electron effects such that a high-energy photon can generate a plurality of electrons.

Such a double tunneling structure can be found, for example, in document DE 10 2005 047 221 B4, see in particular paragraph 9.

According to at least one embodiment, the first diode comprises a first partial layer, a second partial layer and a third partial layer. The double tunnel structure of the first diode is formed in particular by these three partial layers.

According to at least one embodiment, the first partial layer is made of SiGeC. The same applies to the third partial layer. The first and the third partial layers preferably have the same material composition and/or the same layer thicknesses. Alternatively, it is possible for the first and the third partial layers to have different material compositions and/or to have different thicknesses.

According to at least one embodiment, the second partial layer, which is located between the first and the third partial layer, is made of SiGe. In this way, the second partial layer has a comparatively small band gap in comparison to the first and to the third partial layer. In particular, the second partial layer is made of $Si_zGe_{1-z}$, whereas $0.1 \leq z \leq 0.95$, preferably with $0.6 \leq z \leq 0.9$.

According to at least one embodiment, the first, the second and the third partial layers follow one another directly in the stated sequence in the direction away from the front side. Viewed from above, the partial layers can be arranged congruently.

According to at least one embodiment, the first and the third partial layers are made of $(Si_yGe_{1-y})_{1-x}C_x$. In this case, $0.05 \leq x \leq 0.5$ or $0.25 \leq x \leq 0.75$, preferably $0.4 \leq x \leq 0.6$, applies. Alternatively or additionally, $0 \leq y \leq 1$, preferably $0.25 \leq y \leq 0.9$, particularly preferably $0.4 \leq x \leq 0.7$ applies.

According to at least one embodiment, the first and/or the third partial layers have a thickness that is below the tunnel condition, that is, less than 10 nm. Alternatively or additionally, the thicknesses of the first and/or the third partial layers are at least 1 nm.

The lower cell, that is, the second diode, is essentially formed from silicon with a band gap of approximately 1.12 eV and is configured, above all, for generating charge carriers from light in the spectral range between 500 nm and 1150 nm. By inserting the layer of SiGe into the space charge zone of the lower diode with a band gap in the range from 0.66 eV to 0.95 eV, the infrared wavelength range which can be used for generating charge carriers can be expanded to over 1500 nm, which results in an increase in current in comparison to pure silicon.

According to at least one embodiment, the second partial layer has a thickness of at least 5 nm. Alternatively or additionally, the thickness of the second partial layer is at most 25 nm, depending on the thickness of the first and the third partial layer and the material composition of the second layer.

Preferably, the second partial layer is thicker than the first and/or the third partial layer, for example, by at least a factor of 2 thicker than the first and/or the third partial layer.

According to at least one embodiment, the diode layer of the second diode has a thickness of at least 5 nm, in particular a thickness of at least 25 nm. Alternatively or additionally, the thickness of the diode layer is at most 200 nm.

According to at least one embodiment, a second contact layer is located on a side of the diode layer facing away from the front side. The second contact layer may be located directly on the diode layer.

According to at least one embodiment, the second contact layer is a silicon layer. This silicon layer is preferably doped with B and/or Ga and/or Al, for example, with a dopant concentration of at least $1 \times 10^{19}$ $1/cm^3$ for p conductive material or $3 \times 10^{19}$ $1/cm^3$ for n conductive material, that is, above the degenerate; that is, for p conductive material the Fermi level is below the valence band, and for n conductive material the Fermi level is above the conduction band.

According to at least one embodiment, the second contact layer has a thickness of at least 10 nm. Alternatively or additionally, the thickness of the second contact layer is at most 300 nm, depending on the material system, the contact system and the crystallinity of the contact layer.

According to at least one embodiment, a carrier layer is located between the diode layer and the front side. The carrier layer can be located directly on the diode layer. The carrier layer is preferably made of silicon, in particular of n-doped or of p-doped silicon. It is possible for the carrier layer to be the component mechanically supporting and carrying the semiconductor device. For example, the carrier layer has a thickness of at least 30 μm and/or of at most 600 μm. The carrier layer may also be made of a silicide or a transparent conductive oxide or a glass.

According to at least one embodiment, the partial layers of the first diode and/or the diode layer of the second diode and optionally further semiconductor layers of the semiconductor component are monocrystalline or polycrystalline. Alternatively, it is possible for these aforementioned semiconductor layers or at least some of these semiconductor layers to be amorphous.

According to at least one embodiment, the aforementioned semiconductor layers are produced and/or applied by means of chemical vapor deposition, CVD for short, by atomic layer deposition, ALD for short, and/or by means of molecular beam epitaxy, MBE for short. Alternatively, similar deposition methods may also be used, such as plasma assisted depositions.

According to at least one embodiment, the semiconductor component is a tandem solar cell. For this purpose, it is possible for the semiconductor component to comprise further components such as electrodes, current distribution structures and/or electrical contact points for external electrical contacting, in particular for tapping off the photocurrent produced during operation.

BRIEF DESCRIPTION OF THE DRAWINGS

In the following, an optoelectronic semiconductor component described here is explained in more detail with reference to the drawing on the basis of an exemplary embodiment. Identical reference signs indicate identical elements in the individual figures. However, no relationship to scale is shown here, but rather individual elements can be illustrated in an exaggerated manner for better understanding.

DETAILED DESCRIPTION OF ILLUSTRATIVE EMBODIMENTS

Figure 1:
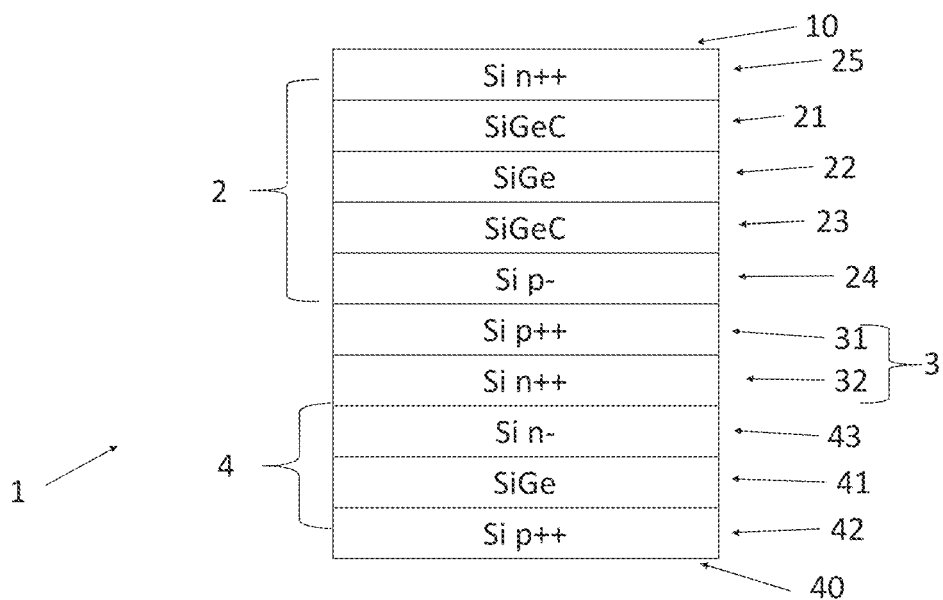
FIGS. 1 and 2 show schematic sectional views of exemplary embodiments of optoelectronic semiconductor components.

An exemplary embodiment of a semiconductor component 1 is shown in FIG. 1. The semiconductor component 1 is configured as a tandem solar cell and comprises a first diode 2 and a second diode 4, which are electrically connected to one another via a tunnel contact 3 and which are connected in series. In this case, the first diode 2 is located closer to a front side 10 of the semiconductor component 1, wherein the front side 10 is preferably a radiation inlet side of the semiconductor component 1.

A first contact layer 25 serves as emitter at the radiation inlet side 10. The first contact layer 25 is made of silicon, which is highly n-doped, for example, with As. The degree of doping of the layers is illustrated by the symbols –, +, ++. A thickness of the first contact layer 25 is preferably at least 10 nm and/or at most 150 nm, for example, at 80 nm. The first contact layer 25 can be a double layer with an initial doping of $1 \times 10^{18}$ 1/cm–3 and a highly doped layer with a dopant concentration of $2 \times 10^{20}$ 1/cm3. The doping preferably increases towards a light inlet layer 5, that is, the transition between the first and second upper contact layers can also be made graduated, that is, the transition does not have to take place abruptly.

The first contact layer 25 is partially included in the first diode 2. A main component of the first diode 2 is formed by three partial layers 21, 22, 23. The first and the third partial layers 21, 23 are SiGeC layers, between which a preferably thin SiGe layer is located as the second partial layer 22. The partial layers 21, 22, 23 are essentially configured to absorb short-wave light in the range from 300 nm to approximately 500 nm, and are used to generate current by means of radiation from this wavelength range.

A low p-doped layer 24 follows the partial layers 21, 22, 23 in the direction away from the radiation inlet side 10. The low-doped layer 24 is preferably a silicon layer doped with B. A thickness of the low-doped layer 24 is, for example, at least 30 nm or 50 nm and at most 200 nm or 100 nm.

The subsequent tunnel contact 3 is composed of a first tunnel contact layer 31 and a second tunnel contact layer 32. The first tunnel contact layer 31 located closer to the radiation inlet side 10 is preferably doped with a silicon layer which is p-doped as far as the degenerate, that is, for example, with more than $8 \times 10^{18}$ 1/cm3 of boron. The second tunnel contact layer 32 is preferably a silicon layer which is n-doped as far as the degenerate, wherein P or As is used as dopant, for example, and the doping should be above $2 \times 10^{19}$ 1/cm3. Thicknesses of the tunnel contact layers 31, 32 are preferably at least 20 nm or 40 nm and/or at most 150 nm or 80 nm, in particular in each case at approximately 50 nm.

The tunnel contact 3 is located directly on a carrier layer 43. The carrier layer 43 is formed by an n-doped or alternatively by a p-doped silicon substrate. A conductivity of the carrier layer 43 is preferably at least 1 Ωcm and/or at most 6 Ωcm. A thickness of the carrier layer 43 is preferably approximately 180 μm.

A diode layer 41, preferably made of SiGe, is located directly on the carrier layer 43, which forms part of the second diode 4. The diode layer 41 is undoped or lightly p-doped. For example, the diode layer 41 has a thickness of 50 nm.

The diode layer 41 is followed by a second contact layer 42 in the direction away from the radiation inlet side 10, the second contact layer 42 is a highly doped p-layer. The dopant used is, for example, B or Ga or Al. A thickness of the second contact layer 42 is, for example, 100 nm.

Figure 2:
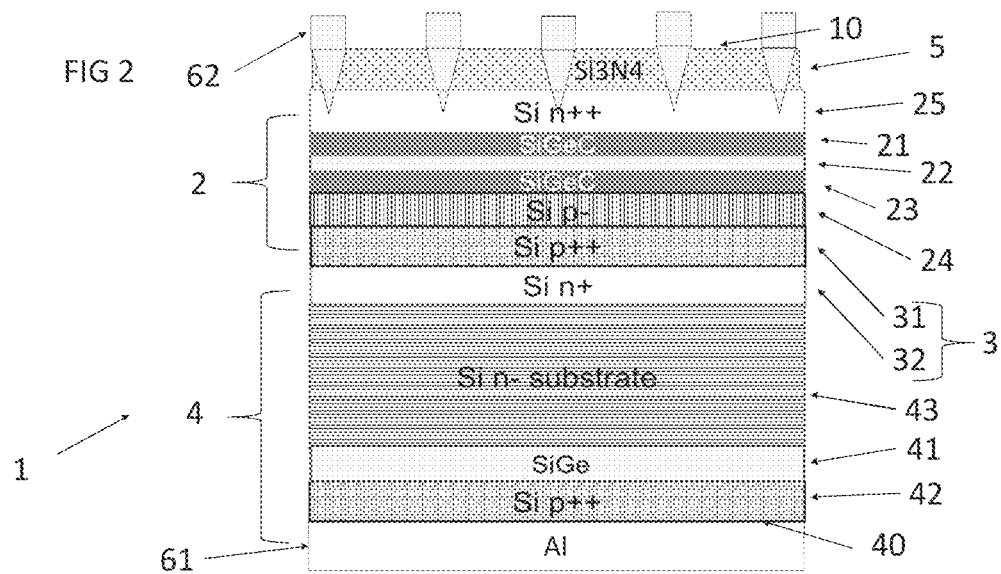

In the exemplary embodiment of FIG. 2, the radiation inlet side 10 is formed by a light inlet layer 5, in particular of a nitride such as silicon nitride, or of a transparent conductive oxide, TCO for short. A thickness of the light inlet layer is, for example, at least 50 nm and/or 90 nm, in particular approximately 65 nm.

A contact layer 62, for example, by means of silver screen printing, is applied to the radiation inlet side 10 for electrical contacting. For this purpose, the optional light inlet layer 5 is preferably removed in places, in particular in a self-adjusting manner, by a known method.

On a rear side 40 opposite the radiation inlet side 10, that is, on the second contact layer 42, a further electrode 61 is preferably applied in a planar or structured manner, for example, by means of aluminum screen printing. A firing process can then be carried out. The semiconductor component 1 designed as a solar cell can thus be produced using standard methods.

Otherwise, the embodiment of FIG. 2 corresponds to that of FIG. 1.

Figure 3:
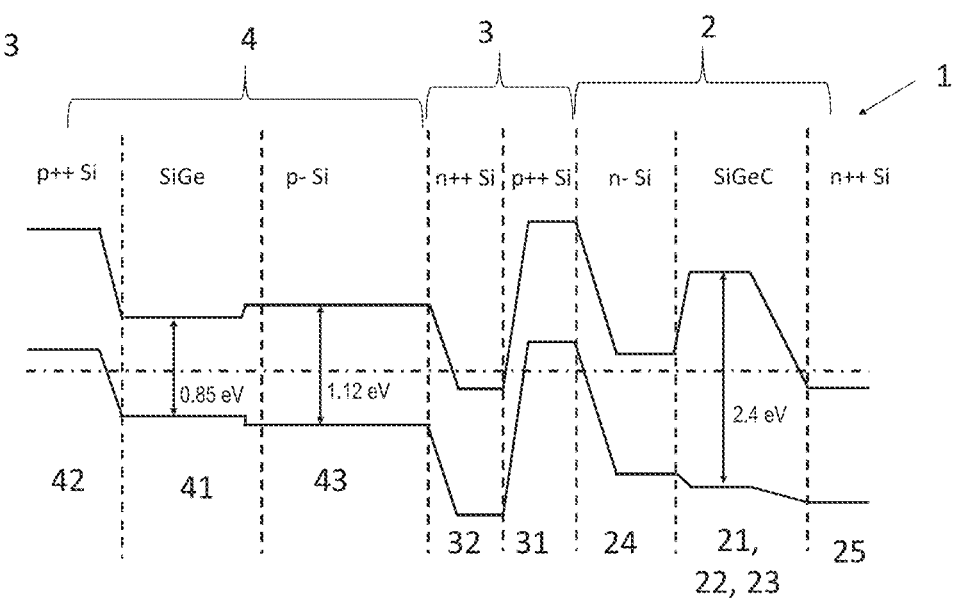
FIG. 3 shows a schematic illustration of a band structure of an optoelectronic semiconductor device described herein.

The electronic band structure resulting from this construction illustrated in conjunction with FIGS. 1 and 2 is schematically illustrated in FIG. 3. The respective band gap in eV is indicated for partial sections. The dash lines symbolize the boundaries between the layers of the semiconductor component 1. The zero line with respect to the band gap is illustrated as a dash-dot line. In contrast to FIG. 1 or 2, according to FIG. 3, other dopings can also be present, for example, in the layers 24, 43.

Figure 4:
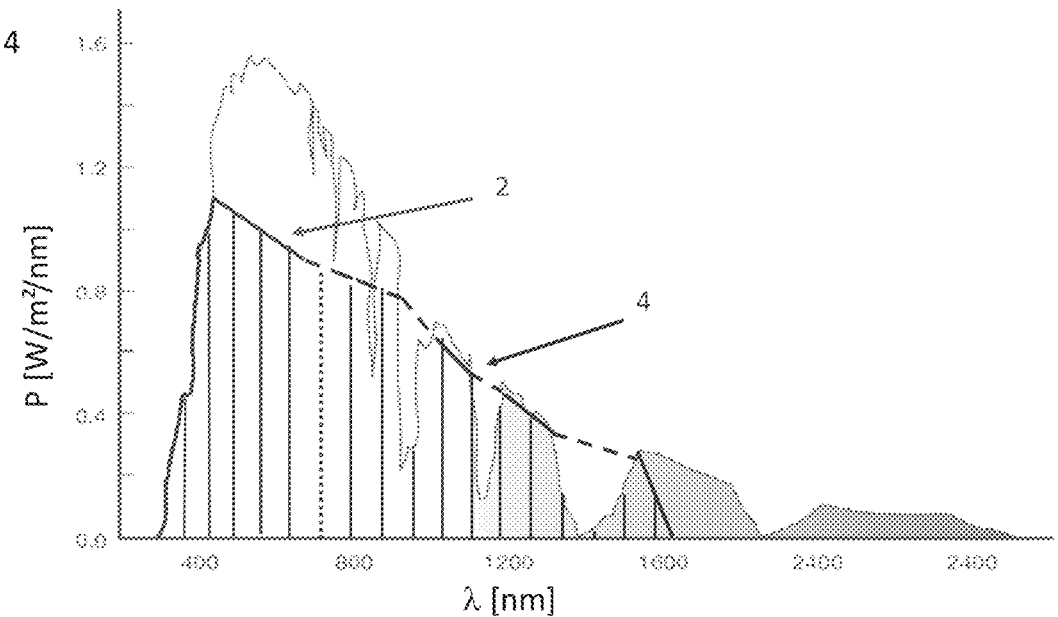
FIG. 4 shows a schematic illustration of spectral properties of an optoelectronic semiconductor device described herein.

In FIG. 4, the light irradiation power P for sunlight in W/m$^2$/nm is shown in relation to the wavelength λ in nm. The absorption ranges for the first diode 2 and the second diode 4 are shown schematically.

Unless otherwise indicated, the components shown in the figures preferably follow one another in each case directly in the specified sequence. Likewise, unless otherwise indicated, the relative positions of the illustrated components with respect to one another are correctly reproduced in the figures.

The invention is not restricted to the exemplary embodiments by the description on the basis of the exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

The invention claimed is:

1. An optoelectronic semiconductor component comprising:
    a front side;
    a first diode and a second diode arranged downstream of one another in a direction away from the front side and electrically connected in series such that the first diode is located closer to the front side than the second diode; and
    an electrical tunnel contact between the first and the second diodes,
    wherein the second diode comprises a diode layer of $Si_nGe_{1-n}$, where 0<n≤0.8,
    wherein the first diode comprises a first partial layer of SiGeC, a second partial layer of SiGe and a third partial layer of SiGeC, and
    wherein the partial layers follow one another directly in the direction away from the front side according to their numbering such that the first and third partial layers are of $(Si_yGe_{1-y},{}_{1-x}C_x)$, whereas 0.05≤x≤0.5 or 0.25≤x≤0.75, and whereas 0.25≤y≤0.9, and the second partial layer is of $Si_zGe_{1-z}$, whereas 0.1≤z≤0.95 so that the optoelectronic semiconductor component comprises the following layers following directly one above another:
    a first contact layer made of n-doped silicon at the front side,
    the first partial layer,
    the second partial layer,
    the third partial layer,
    a first tunnel contact layer of the electrical tunnel contact made of degeneratively p-doped silicon,
    a second tunnel contact layer of the electrical tunnel contact made of degeneratively n-doped silicon,
    a carrier layer which is an n-doped or a p-doped silicon substrate,
    the diode layer of the second diode, and
    a second contact layer which is a silicon layer.

2. The optoelectronic semiconductor component according to claim 1, wherein the first diode is configured to:
    absorb first radiation in a first wavelength range between 300 nm and 500 nm; and
    generate first charge carriers by the first radiation.

3. The optoelectronic semiconductor component according to claim 2, wherein the second diode is configured to:
    absorb second radiation in a second wavelength range between 500 nm and 1500 nm; and
    generate second charge carriers by the second radiation.

4. The optoelectronic semiconductor component according to claim 1, wherein each of the first and the third partial layers has a thickness of between 1 nm and 10 nm inclusive, and wherein the second partial layer has a thickness between 5 nm and 25 nm inclusive.

5. The optoelectronic semiconductor component according to claim 4, wherein the diode layer has a thickness of between 5 nm and 200 nm inclusive.

6. The optoelectronic semiconductor component according to claim 1, wherein the partial layers consists essentially of a material with a high band spacing so that a band gap of the material is between 2.4 eV and 3.2 eV inclusive.

7. The optoelectronic semiconductor component according to claim 6, wherein the diode layer has a band gap in a range from 0.66 eV to 0.95 eV inclusive.

8. The optoelectronic semiconductor component according to claim 1, wherein the second contact layer is the silicon layer doped with B, Al and/or Ga with a dopant concentration of at least $1\times10^{19}$ 1/cm$^3$.

9. The optoelectronic semiconductor component according to claim 8, wherein the second contact layer has a thickness between 30 nm and 300 nm inclusive, and wherein the diode layer directly adjoins the carrier layer with a thickness of between 30 μm and 600 μm inclusive in a direction towards the front side.

10. The optoelectronic semiconductor component according to claim 1, wherein the second contact layer has a thickness between 30 nm and 300 nm inclusive, and wherein the diode layer directly adjoins the carrier layer with a thickness of between 30 μm and 600 μm inclusive in a direction towards the front side.

11. The optoelectronic semiconductor component according to claim 1, wherein semiconductor layers of the first and second diodes are polycrystalline.

12. The optoelectronic semiconductor component according to claim 1, wherein semiconductor layers of the first and second diodes are amorphous.

13. The optoelectronic semiconductor component according to claim 1, wherein the optoelectronic semiconductor component is a tandem solar cell.

* * * * *

UNITED STATES PATENT AND TRADEMARK OFFICE
CERTIFICATE OF CORRECTION

PATENT NO. : 11,233,167 B2
APPLICATION NO. : 16/632951
DATED : January 25, 2022
INVENTOR(S) : Andreas Paul Schueppen It is certified that error appears in the above-identified patent and that said Letters Patent is hereby corrected as shown below:

In the Claims

Claim 1, Column 7, Line 41; delete "$Si_yGe_{1-y, \, i-x}C_x$," and insert --$Si_yGe_{1-y})_{1-x}C_x$--.

Signed and Sealed this
Twenty-sixth Day of April, 2022

Katherine Kelly Vidal
*Director of the United States Patent and Trademark Office*